United States Patent

Oonishi

(10) Patent No.: US 11,721,998 B2
(45) Date of Patent: Aug. 8, 2023

(54) BACKUP BATTERY CONTROL MODULE AND BACKUP BATTERY CONTROL SYSTEM

(71) Applicant: Yazaki Corporation, Tokyo (JP)

(72) Inventor: Saki Oonishi, Susono (JP)

(73) Assignee: Yazaki Corporation, Tokyo (JP)

( * ) Notice: Subject to any disclaimer, the term of this patent is extended or adjusted under 35 U.S.C. 154(b) by 0 days.

(21) Appl. No.: 17/556,438

(22) Filed: Dec. 20, 2021

(65) Prior Publication Data

US 2022/0200311 A1 Jun. 23, 2022

(30) Foreign Application Priority Data

Dec. 21, 2020 (JP) ................................ 2020-210926

(51) Int. Cl.
*H02J 7/00* (2006.01)
*H02J 9/04* (2006.01)
*G01R 31/389* (2019.01)
*G01K 13/00* (2021.01)
*G01R 31/392* (2019.01)
*G01R 31/3835* (2019.01)

(52) U.S. Cl.
CPC .......... *H02J 7/00712* (2020.01); *G01K 13/00* (2013.01); *G01R 31/389* (2019.01); *G01R 31/3835* (2019.01); *G01R 31/392* (2019.01); *H02J 7/005* (2020.01); *H02J 7/0048* (2020.01); *H02J 7/0063* (2013.01); *H02J 9/04* (2013.01)

(58) Field of Classification Search
CPC ........ B60L 3/0023; B60L 3/0046; B60L 3/12; B60L 58/10; B60L 58/13; B60L 58/14; B60L 58/15; B60L 58/21; B60L 2240/545; H01M 10/441; H01M 10/482; Y02E 60/10
See application file for complete search history.

(56) References Cited

U.S. PATENT DOCUMENTS

| | | | |
|---|---|---|---|
| 2003/0178970 A1 * | 9/2003 | Minamiura | H02J 7/0029 320/116 |
| 2016/0218544 A1 | 7/2016 | Ogihara | |
| 2019/0260225 A1 | 8/2019 | Hida et al. | |

FOREIGN PATENT DOCUMENTS

| | | |
|---|---|---|
| JP | 2017-116336 A | 6/2017 |
| JP | 2017-129401 A | 7/2017 |
| JP | 2018-170821 A | 11/2018 |
| WO | 2018/180333 A1 | 10/2018 |
| WO | WO-2018180333 A1 * | 10/2018 ............ H01M 10/48 |

* cited by examiner

*Primary Examiner* — Elim Ortiz
(74) *Attorney, Agent, or Firm* — Banner & Witcoff, Ltd.

(57) ABSTRACT

A backup battery control module configured to supply electric power from a backup battery to a load when electric power supplied from a main battery to the load is cut off. The backup battery control module is configured to: measure an open circuit voltage of the backup battery in a state in which an ignition switch is off; derive, based on a measured open circuit voltage, an already charged rate of the backup battery; measure an internal resistance of the backup battery in a state in which the ignition switch is off; derive a deterioration degree of the backup battery based on a measured internal resistance; derive a target charging rate based on the deterioration degree; and charge the backup battery until the target charging rate is reached in a case in which it is determined that the already charged rate is smaller than the target charging rate.

12 Claims, 4 Drawing Sheets

*FIG. 2A*
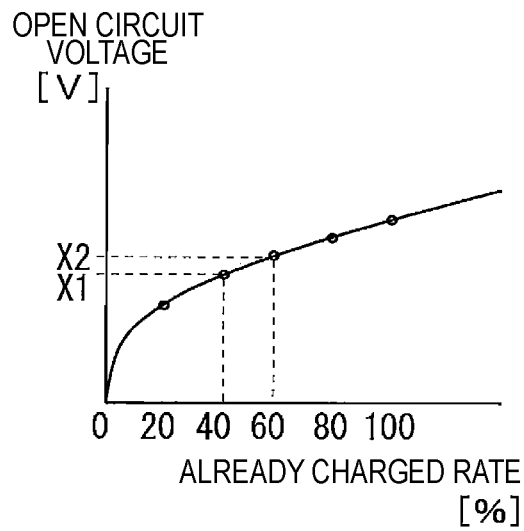
*FIG. 2B*
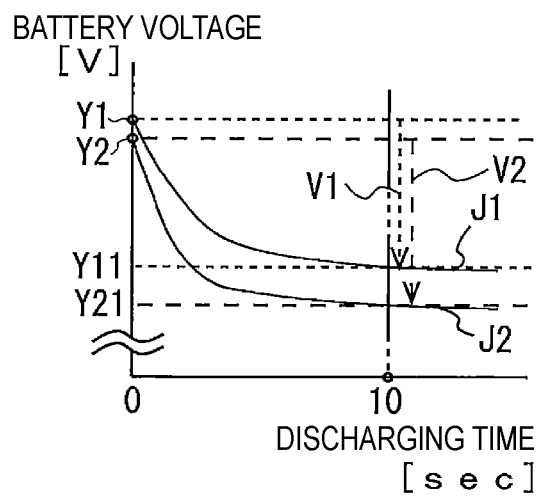
*FIG. 2C*
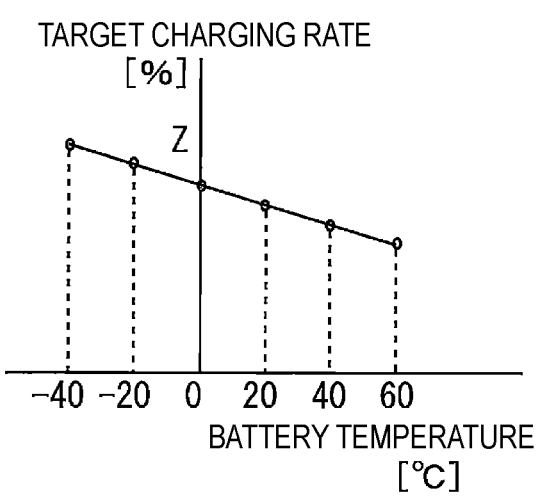
*FIG. 2D*
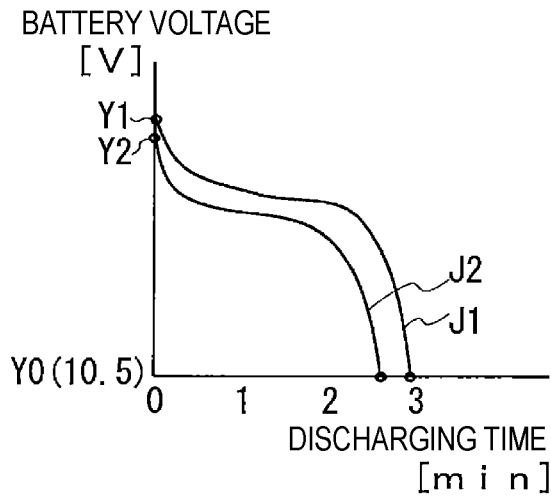
*FIG. 2E*
| | | BATTERY TEMPERATURE (°C) | | | | | | |
|---|---|---|---|---|---|---|---|---|
| | | -40 | -20 | 0 | 20 | 40 | 50 | 60 |
| DETE-RIORA-TION DEGREE (%) | 5 | a7 | a6 | a5 | a4 | a3 | a2 | a1 |
| | 10 | b7 | b6 | b5 | b4 | b3 | b2 | b1 |
| | 15 | c7 | c6 | c5 | c4 | c3 | c2 | c1 |
| | 20 | d7 | d6 | d5 | d4 | d3 | d2 | d1 |

BACKUP BATTERY CONTROL MODULE AND BACKUP BATTERY CONTROL SYSTEM

CROSS-REFERENCE TO RELATED APPLICATIONS

This application is based on and claims the benefit of priority of Japanese Patent Application No. 2020-210926 filed on Dec. 21, 2020, the entire contents of which are incorporated herein by reference.

FIELD

The present disclosure relates to a backup battery control module and a backup battery control system.

BACKGROUND

In the related art, a battery system is disclosed in which an internal resistance value of a lithium ion secondary battery is estimated based on a temperature, an overvoltage is calculated by multiplying the internal resistance value by a current value flowing in and out of the lithium ion secondary battery, an open circuit voltage value is calculated by subtracting the overvoltage from a closed circuit voltage value, and a remaining capacity is estimated from the open circuit voltage value (for example, see JP-A-2017-116336). Accordingly, it is described that the battery system improves an estimation accuracy of the remaining capacity of the lithium ion secondary battery.

SUMMARY

Here, a vehicle travels by supplying electric power of a battery to a load such as a driver assistance device (a driver assistance device for collision prevention, lane change, and the like) of an automatic driving vehicle and the like. Further, for such a vehicle, it is considered to mount a backup battery in order to secure electric power for continuing the driving of the load such as the driver assistance device for a certain period of time even when the supply of the electric power from the main battery to the load such as the driver assistance device is interrupted due to disconnection and the like.

However, even if such a technique is applied to, for example, a backup battery that is not normally used, a remaining capacity of the backup battery decreases due to self-discharge. If the control is not appropriately performed, a situation may occur in which a sufficient remaining capacity does not remain when driving of a load (a load for causing the vehicle to travel) such as a driver assistance device is continued.

In view of the above circumstances, an object of the present disclosure is to provide a backup battery control module and a backup battery control system capable of reducing occurrence of a situation, in which a backup battery does not secure a required remaining capacity required to continue driving of a load for causing a vehicle to travel when electric power supply by a main battery is cut off and the driving of the load for causing the vehicle to travel is to be continued, as compared with the related art.

The present disclosure provides a backup battery control module configured to supply electric power from a main battery to a load required for causing a vehicle to travel and supply electric power from a backup battery to the load when electric power supply from the main battery to the load is cut off, the backup battery control module including: an open circuit voltage measurement unit configured to measure an open circuit voltage of the backup battery every first predetermined time in a state in which an ignition switch is off, to obtain a measured open circuit voltage; an already charged rate derivation unit configured to derive, based on the measured open circuit voltage, an already charged rate of the backup battery that has already been charged; an internal resistance measurement unit configured to measure an internal resistance of the backup battery at every second predetermined time in a state in which the ignition switch is off, to obtain a measured internal resistance; a deterioration degree derivation unit configured to derive a deterioration degree of the backup battery based on the measured internal resistance; a target charging rate derivation unit configured to derive a target charging rate serving as a charging target based on the deterioration degree such that a required remaining capacity required for the load is secured in the backup battery even when the electric power supply from the main battery to the load is cut off; and a charging control unit configured to charge the backup battery until the target charging rate is reached in a case in which it is determined that the already charged rate is smaller than the target charging rate.

According to the present disclosure, it is possible to reduce occurrence of a situation, in which a backup battery does not secure a required remaining capacity required to continue driving of a load for causing a vehicle to travel when electric power supply by a main battery is cut off and the driving of the load for causing the vehicle to travel is to be continued, as compared with the related art.

BRIEF DESCRIPTION OF DRAWINGS

FIG. 2A is a graph showing a relationship between an open circuit voltage and an already charged rate of a backup battery. FIG. 2B is a graph showing a relationship between a battery voltage and a discharging time of the backup battery when the discharging time is short. FIG. 2C is a graph showing a relationship between a target charging rate and a battery temperature of the backup battery. FIG. 2D is a graph showing a relationship between the battery voltage and the discharging time of the backup battery when the discharging time is long. FIG. 2E is a table showing the target charging rate based on a deterioration degree and the battery temperature of the backup battery.

DETAILED DESCRIPTION

Hereinafter, the present disclosure will be described in accordance with a preferred embodiment. The present disclosure is not limited to the following embodiments, and can be appropriately changed without departing from the scope of the present disclosure. Further, some configurations are not shown or described in the embodiments described below, but it goes without saying that a known or well-known technique is applied as appropriate to details of an omitted technique within a range in which no contradiction occurs to contents described below.

Figure 1:
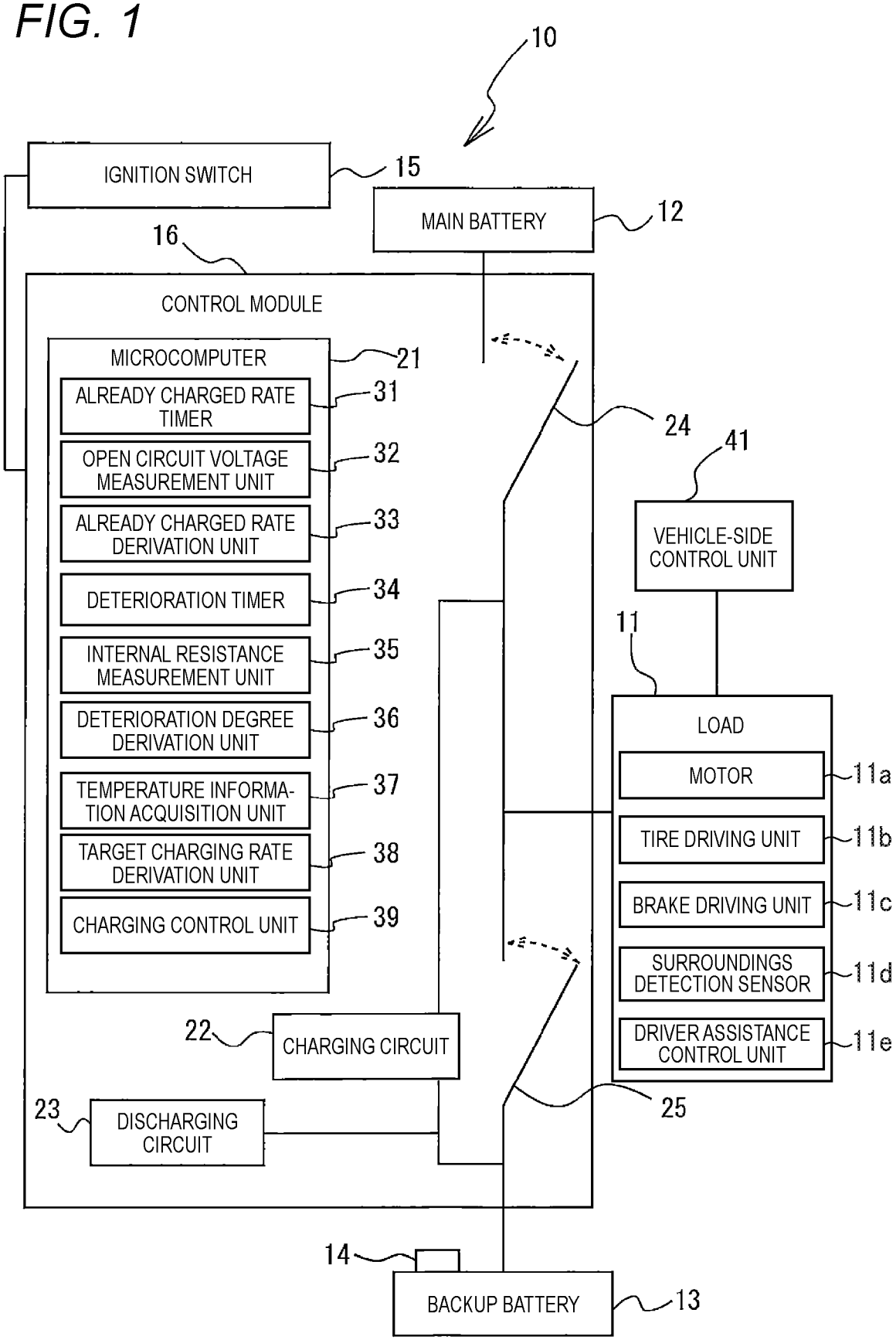
FIG. 1 is a block diagram of a control system including a control module according to an embodiment of the present disclosure.

FIG. 1 is a block diagram of a control system 10 including a control module 16 according to an embodiment of the present disclosure. The control system 10 and the control module 16 are used in a self-driving vehicle (not shown). The self-driving vehicle means, for example, a vehicle that can autonomously travel without a person performing a driving operation. The self-driving vehicle autonomously travels only by recognizing the surrounding environment with a radar, a GPS, a camera, and the like and designating a destination. It is assumed that the self-driving vehicle of the present embodiment is capable of being autonomously driven by a driver on the vehicle, and is capable of being manually driven by the driver by switching to manual driving. The control system 10 is an example of a backup battery control system, and the control module 16 is an example of a backup battery control module.

The control system 10 (backup battery control system) includes a load 11, a main battery 12, a backup battery 13, a battery temperature sensor 14, an ignition switch 15, and a control module 16 (backup battery control module). Among them, the load 11, the main battery 12, the backup battery 13, the battery temperature sensor 14, and the ignition switch 15 are mounted in a vehicle (not shown) of a self-driving vehicle (not shown) in advance, and the control module 16 according to the present embodiment can be retrofitted to such a configuration. Although a vehicle-side control unit 41 is also shown in FIG. 1, the vehicle-side control unit 41 is mounted on the vehicle of the self-driving vehicle in advance, and is connected to the load 11 and the like to control driving of the load 11 and the like.

The load 11 includes, for example, a motor 11a, a tire driving unit 11b that drives a tire direction in a left-right direction, a brake driving unit 11c, a surroundings detection sensor 11d that detects another vehicle or an object around the vehicle, a driver assistance control unit 11e that controls the motor 11a, the tire driving unit 11b, the brake driving unit 11c, and the like based on a detection result of the surroundings detection sensor 11d, and the like in a vehicle of a self-driving vehicle, and is required to cause the vehicle to travel. The main battery 12 is a battery capable of supplying electric power to the load 11. The backup battery 13 is a battery instead of the main battery 12 capable of supplying electric power to the load 11. The battery temperature sensor 14 is attached to the backup battery 13 and detects the battery temperature of the backup battery 13.

The control module 16 supplies the electric power from the main battery 12 to the load 11 required to cause the vehicle to travel, and supplies the electric power from the backup battery 13 to the load 11 when the electric power supply from the main battery 12 to the load 11 is cut off. The control module 16 includes a microcomputer 21, a charging circuit 22, a discharging circuit 23, and switches 24 and 25. As described above, the control module 16 is retrofitted (in an add-on form) to the vehicle of the self-driving vehicle. Therefore, the microcomputer 21 is provided separately from the vehicle-side control unit 41 that controls the driving of the vehicle. The microcomputer 21 controls driving of the charging circuit 22, the discharging circuit 23, and the switches 24 and 25.

In a state where the switch 24 is turned on and the switch 25 is turned off, the microcomputer 21 connects the main battery 12 and the load 11, and connects the main battery 12 and the charging circuit 22. Then, the electric power of the main battery 12 is used to drive the load 11, and is used to charge the backup battery 13 by the charging circuit 22.

Further, when the switch 25 is turned on and the switch 24 is turned off, the microcomputer 21 connects the backup battery 13 and the load 11. Therefore, the electric power of the backup battery 13 is used to drive the load 11.

The charging circuit 22 is a circuit for charging the backup battery 13 with electricity of the main battery 12. The discharging circuit 23 functions as a dedicated constant current discharge system and is a circuit for discharging electricity held by the backup battery 13. An internal resistance of the backup battery 13 can be measured by a voltage drop of the backup battery 13 due to the discharge.

Hereinafter, the configuration of the microcomputer 21 will be described in detail. The microcomputer 21 includes an already charged rate timer 31, an open circuit voltage measurement unit 32, an already charged rate derivation unit 33, a deterioration timer 34, an internal resistance measurement unit 35, a deterioration degree derivation unit 36, a temperature information acquisition unit 37, a target charging rate derivation unit 38, and a charging control unit 39. The microcomputer 21 may include a processor and a memory storing instructions that, when executed by the processor, cause the microcomputer 21 to perform operations by at least one of the elements 31 to 39.

[When Ignition Switch is Off, Already Charged Rate is Derived]

The already charged rate timer 31 measures a first predetermined time (for example, half a day). Based on the measurement result, the microcomputer 21 drives the open circuit voltage measurement unit 32 and the already charged rate derivation unit 33 every first predetermined time (for example, every half day).

The open circuit voltage measurement unit 32 measures an open circuit voltage (OCV) of the backup battery 13 every first predetermined time when the ignition switch 15 is off.

The already charged rate derivation unit 33 derives an already charged rate of the backup battery 13 that has already been charged, based on a measurement result of the open circuit voltage measurement unit 32.

When the ignition switch 15 is off, the open circuit voltage measurement unit 32 measures the open circuit voltage. This is because it is difficult for the open circuit voltage measurement unit 32 to accurately measure the open circuit voltage when the ignition switch 15 is on (for example, when the vehicle is traveling).

FIG. 2A is a graph showing a relationship between the open circuit voltage and the already charged rate of the backup battery 13. A vertical axis represents the open circuit voltage of the backup battery 13, and a horizontal axis represents the already charged rate of the backup battery 13. As shown in FIG. 2A, as the open circuit voltage of the backup battery 13 is measured by the open circuit voltage measurement unit 32 with a large value, the already charged rate of the backup battery 13 is derived by the already charged rate derivation unit 33 with a large value. FIG. 2A shows that the already charged rate is 40[%] when the open circuit voltage X1 [V] is applied, and the already charged rate is 60[%] when the open circuit voltage X2 [V] is applied.

[Derive Deterioration Degree When Switch is Off]

The deterioration timer 34 measures a second predetermined time (for example, one month). Based on the measurement result, the microcomputer 21 drives the internal resistance measurement unit 35 and the deterioration degree derivation unit 36 every second predetermined time (for example, every month).

When the ignition switch 15 is off, the internal resistance measurement unit 35 acquires the internal resistance of the backup battery 13 at every second predetermined time. Here, the internal resistance measurement unit 35 measures, for example, voltage drop amounts when a new backup battery 13 and a current backup battery 13 are discharged at a specified current, and measures the internal resistance based on the voltage drop amount and the discharge current.

The deterioration degree derivation unit 36 derives the deterioration degree of the backup battery 13 based on the voltage drop amount and the discharge current of the internal resistance measurement unit 35. Hereinafter, the content will be described in detail.

FIG. 2B is a graph showing a relationship between a battery voltage and a discharging time of the backup battery 13 when the discharging time is short. The vertical axis represents the battery voltage of the backup battery 13, and the horizontal axis represents the discharging time of the backup battery 13. A graph J1 is a graph (0% deterioration) of a new backup battery 13, and a graph J2 is a graph (for example, 20% deterioration) of a current (used) backup battery 13 after a predetermined period has elapsed from the start of use. These graphs J1 and J2 mainly show a drop amount of the battery voltage when a discharge current 10 A is discharged for a discharging time of about 10 seconds in the new backup battery 13 and the current backup battery 13.

In general, when a constant current is discharged from a battery, a voltage drop of a battery voltage occurs due to an internal resistance of the battery as shown in FIG. 2B. Since the internal resistance increases when the battery deteriorates, the voltage drop amount of the deteriorated battery is measured to be large (see V2 of J2 in FIG. 2B), and the voltage drop amount of the new battery is measured to be small (see V1 of J1 in FIG. 2B). Therefore, the internal resistance based on the voltage drop amount of the deteriorated battery is calculated to be large, the internal resistance based on the voltage drop amount of the new battery is calculated to be small, and the degree of increase in the internal resistance of the deteriorated battery compared to the internal resistance of the new battery is derived as the deterioration degree of the current battery.

[Measurement of Internal Resistance]

The internal resistance measurement unit 35 discharges the new backup battery 13 from a charging state for a predetermined time, and calculates and measures the internal resistance at the time of new battery based on the voltage drop amount of the battery voltage that drops during the predetermined time and the discharge current. Then, information of the internal resistance at the time of new battery of the new backup battery 13 measured by the internal resistance measurement unit 35 is stored by the deterioration degree derivation unit 36 (the information of the internal resistance at the time of new battery may be stored as an initial value in the deterioration degree derivation unit 36 during manufacturing).

The above will be described with reference to FIG. 2B. For example, the internal resistance measurement unit 35 receives data of the battery voltage and the discharging time of the graph J1 of FIG. 2B. As shown in FIG. 2B, in the new backup battery 13, the battery voltage before the discharge is Y1 [mV], the battery voltage after the discharge is Y11 [mV], and the voltage drop amount is V1 [mV].

By using the data, the internal resistance measurement unit 35 calculates, from the voltage drop due to the predetermined current (10 A) for several seconds (10 seconds), an internal resistance R1 at the time of new battery as follows:

the internal resistance R1[mΩ] at the time of new battery=(the battery voltage Y1[mV] before the discharge-the battery voltage Y11 [mV] after the discharge)/the discharge current(10[A])=the voltage drop amount V1[mV]/the discharge current(10[A]).

Then, the deterioration degree derivation unit 36 stores the information of the internal resistance R1 [mΩ] at the time of new battery of the new backup battery 13=the voltage drop amount V1 [mV]/the discharge current (10 [A]), which is measured by the internal resistance measurement unit 35.

[Calculation of Deterioration Degree]

Thereafter, the internal resistance measurement unit 35 discharges the current backup battery 13 from a charging state for a predetermined time, and calculates and measures the current internal resistance based on the voltage drop amount of the battery voltage that drops during the predetermined time and the discharge current. Then, by using the current internal resistance measured by the internal resistance measurement unit 35, the deterioration degree derivation unit 36 derives an increased internal resistance that has increased until the current time after the predetermined period has elapsed from the time of new battery, and derives the deterioration degree of the current backup battery 13 by deriving a ratio of the increased internal resistance to the internal resistance at the time of new battery.

The above will be described with reference to FIG. 2B. For example, the internal resistance measurement unit 35 receives data of the battery voltage and the discharging time of the graph J2 of FIG. 2B. As shown in FIG. 2B, in the current backup battery 13, the battery voltage before the discharge is Y2 [mV], the battery voltage after the discharge is Y21 [mV], and the voltage drop amount is V2 [mV].

By using the data, the internal resistance measurement unit 35 calculates, from the voltage drop due to the predetermined current (10 A) for several seconds (10 seconds), a current internal resistance R2 as follows:

the current internal resistance $R2[m\Omega] =$ (a battery voltage $Y2[mV]$ before the discharge $-$ a battery voltage $Y21[mV]$ after the discharge)/the discharge current $(10[A]) =$ a voltage drop amount $V2[mV]/$ the discharge current $(10[A]).$ Then, by using the current internal resistance R2 measured by the internal resistance measurement unit 35, the deterioration degree derivation unit 36 derives the deterioration degree as follows:

the deterioration degree [%] =

{(the current internal resistance $R2[m\Omega] -$ the internal resistance $R1[m\Omega]$ at the time of new battery)/

(the internal resistance $R1[m\Omega]$ at the time of new battery)} $\times 100 =$ {$(V2[mV]/10[A] - V1[mV]/10[A])/(V1[mV]/10[A])$} $\times 100 =$ {$(V2 - V1)/(V1)$} $\times 100[\%].$ As described above, the internal resistance measurement unit 35 derives the deterioration degree from the viewpoint of an amount of the internal resistance of the current backup battery 13 increases with respect to the internal resistance of the backup battery 13 at the time of new battery.

[Charging based on Deterioration Degree and Temperature when Switch is On]

The temperature information acquisition unit 37 acquires temperature information of the backup battery 13 from the battery temperature sensor 14. This is because the temperature also affects a charging rate of the backup battery 13.

When the ignition switch 15 is on, the target charging rate derivation unit 38 acquires a target charging rate serving as a charging target based on a derivation result by the deterioration degree derivation unit 36 and the temperature information acquired by the temperature information acquisition unit 37 such that a required remaining capacity required for the load 11 is secured in the backup battery 13 when the electric power supply from the main battery 12 to the load 11 is cut off. The target charging rates are a1 to a7 [%], b1 to b7 [%], c1 to c7 [%], and d1 to d7 [%] in FIG. 2E described later.

The target charging rate is the remaining capacity of the backup battery 13 required to continue the driving of the load for causing the self-driving vehicle to travel with respect to the remaining capacity of the backup battery 13 having a charging rate of 100%. A relationship between the target charging rate and the deterioration degree and a relationship between the target charging rate and the battery temperature are theoretically considered as follows.

For example, it is assumed that the remaining capacity of the new backup battery 13 having the charging rate of 100% is 30000 [Asec], the remaining capacity of the current backup battery 13 having the charging rate of 100% is 24000 [Asec], and the required remaining capacity required to continue the driving of the load for causing the self-driving vehicle to travel is a remaining capacity for flowing a current of 80 A for 3 minutes. The required remaining capacity is 80 A×180 sec (3 minutes)=14400 [Asec]. Therefore, the target charging rate of the new backup battery 13 is 14400 [Asec]/30000 [Asec]=48%. Further, the target charging rate of the current backup battery 13 is 14400 [Asec]/24000 [Asec]=60%.

As described above, the target charging rate derivation unit 38 needs to calculate the target charging rate to be larger as the deterioration degree of the backup battery 13 is larger (see FIG. 2E).

Since the capacity decreases as the temperature decreases, the target charging rate derivation unit 38 needs to calculate the target charging rate to be larger as the temperature of the backup battery 13 decreases (see FIG. 2E and FIG. 2C).

When it is determined that the already charged rate is smaller than the target charging rate, the charging control unit 39 charges the backup battery 13 until the already charged rate reaches the target charging rate acquired by the target charging rate derivation unit 38. The charging control unit 39 charges the backup battery 13 with a required charging capacity acquired by integrating currents flowing from the charging circuit 22 to the backup battery 13 every 1 second. When the ignition switch 15 is on, the charging control unit 39 charges the backup battery 13 until the target charging rate is reached. Accordingly, a capacity of the main battery 12 is prevented from being lowered as in a case of charging when the ignition switch 15 is off.

FIG. 2C is a graph showing the relationship between the target charging rate and the battery temperature of the backup battery 13. The vertical axis represents the target charging rate of the backup battery 13, and the horizontal axis represents the battery temperature of the backup battery 13. An appropriate temperature of the backup battery 13 is −40° C. to 60° C. Within a range of such the appropriate temperature, the backup battery 13 has a property in which a battery capacity increases as the battery temperature increases and the battery capacity decreases as the battery temperature decreases. Therefore, as shown in FIG. 2C, the higher the battery temperature is, the smaller the target charging rate is, and the lower the battery temperature is, the larger the target charging rate is required.

FIG. 2E is a table showing the target charging rate based on the deterioration degree and the battery temperature of the backup battery 13.

Columns are classified by setting the deterioration degree to 5%, 10%, 15%, and 20%, and for example, when the battery temperature is −40° C., the target charging rate increases in order of a7%, b7%, c7%, and d7% as the deterioration degree increases in order of 5%, 10%, 15%, and 20% (a<b<c<d). When the battery temperature is other temperature between −40° C. and 60° C., the temperature is set in the same manner.

Rows are classified by setting the battery temperature to −40° C. to 60° C., and for example, when the deterioration degree is 20%, as the battery temperature sequentially decreases from 60° C. to −40° C., the target charging rate sequentially increases from d1 to d7 (d7>d6>d5>d4>d3>d2>d1). When the deterioration degree is another numerical value, the deterioration degree is set in the same manner.

In short, the target charging rate is set to be larger as the deterioration degree is higher, and is set to be larger as the battery temperature is lower.

For example, it is assumed that the current backup battery 13 has a remaining capacity of 24000 [Asec] when the charging rate is 100% and a remaining capacity of 14400 [Asec] when the charging rate is 60%. In such a situation, the already charged rate derivation unit 33 derives the already charged rate as 60% based on the measurement result of the open circuit voltage measurement unit 32. Further, it is assumed that the deterioration degree derivation unit 36 derives the deterioration degree as 20% based on a measurement result of the internal resistance measurement unit 35. Further, it is assumed that the temperature information acquisition unit 37 acquires the battery temperature as 20° C. based on a detection result of the battery temperature sensor 14. In this case, the target charging rate derivation unit 38 sets d4 in FIG. 2E as the target charging rate. When 60% of the already charged rate is smaller than d4 of the target charging rate, the charging control unit 39 performs charging until the target charging rate d4 is reached.

Figure 3:
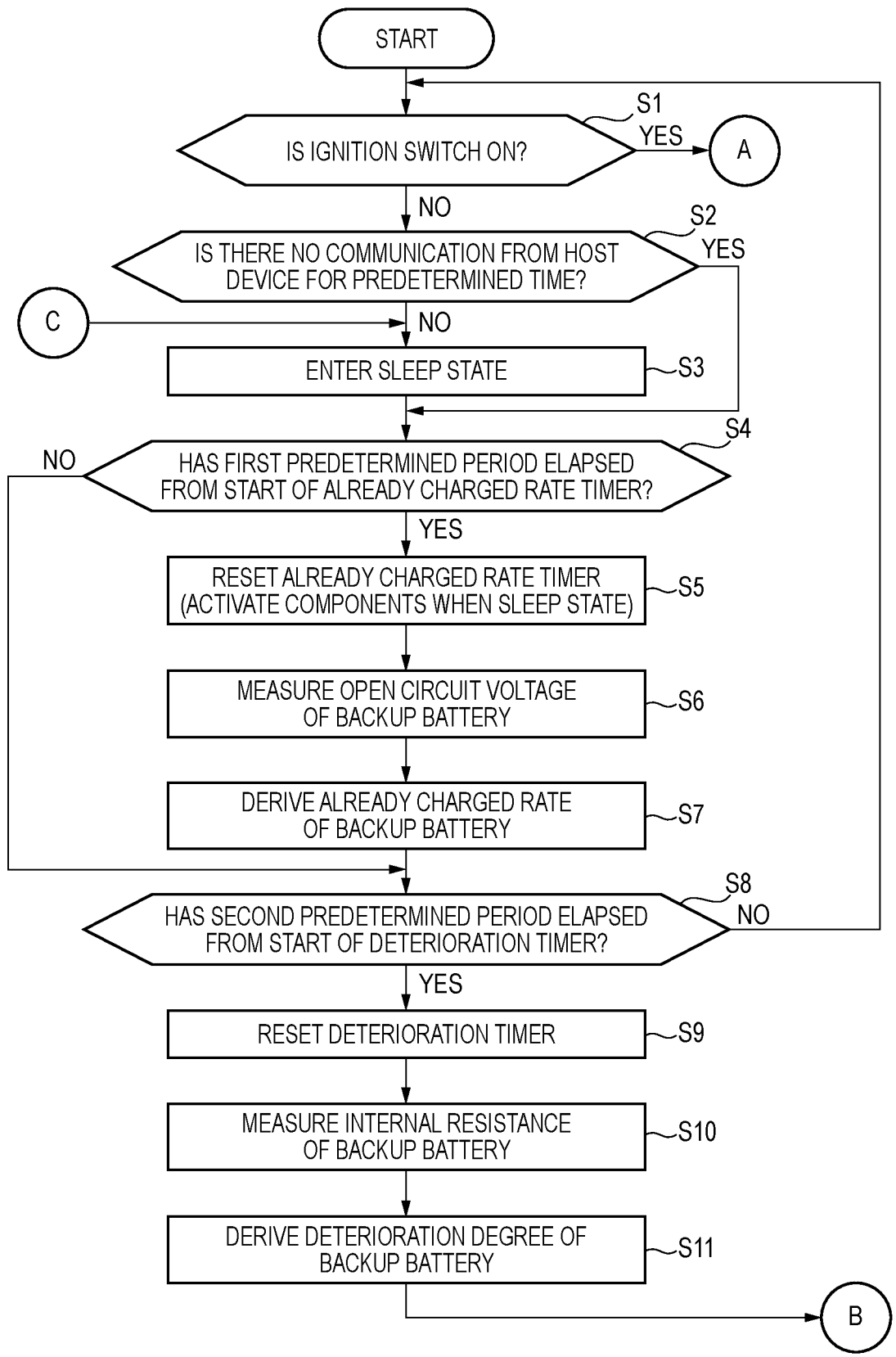
FIG. 3 is a flowchart showing a control process of a microcomputer.
Figure 4:
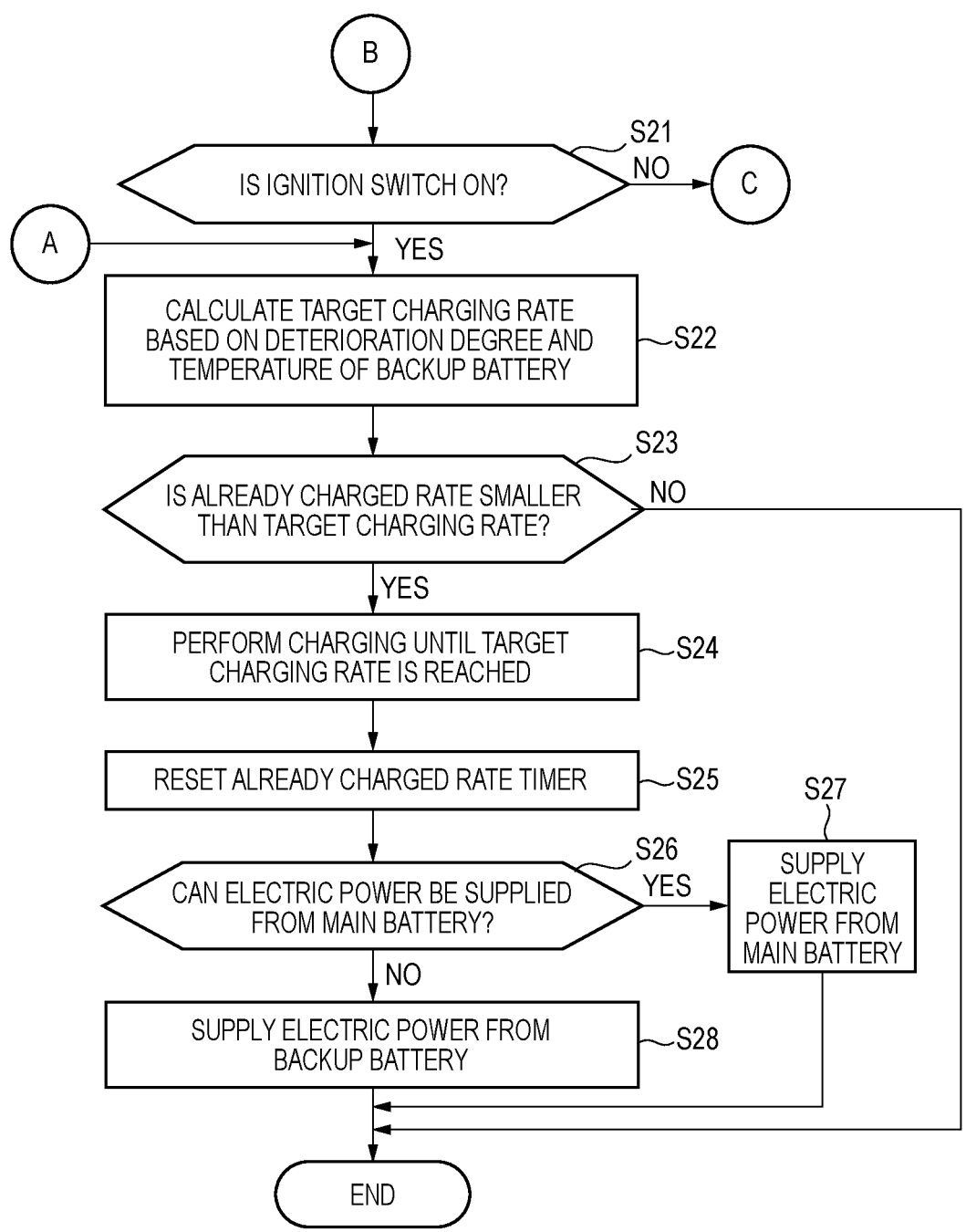
FIG. 4 is a flowchart showing a control process of a microcomputer.

Next, a control process of the microcomputer 21 of the control module 16 according to the present embodiment will be described with reference to FIGS. 3 and 4. FIGS. 3 and 4 are flowcharts showing a control process of the microcomputer 21. Since there is a plurality of units inside the microcomputer 21 as shown in FIG. 1, the following description will be made by specifying the subject of control as much as possible.

As shown in FIG. 3, the microcomputer 21 determines whether the ignition switch 15 is on (step 1, hereinafter "step" is indicated as "S"; S1). When it is determined in S1 that the ignition switch 15 is on (S1: YES), the process proceeds to A of FIG. 4. When it is determined in S1 that the ignition switch 15 is not on (S1: NO), the microcomputer 21 determines whether there is no communication from a host device (not shown) for a predetermined time (S2). When it is determined in S2 that there has been the communication performed within the predetermined time (S2: YES), the process proceeds to S4. When it is determined in S2 that there is no communication for the predetermined time (S2: NO), the process proceeds to a sleep state in which a timer other than the already charged rate timer 31 and the deterioration timer 34 is not activated (S3). The microcomputer 21 determines whether a first predetermined period has elapsed from start of the already charged rate timer 31 (S4).

When it is determined in S4 that the first predetermined period has elapsed from start of the already charged rate timer 31 (S4: NO), the process of the microcomputer 21 proceeds to S8.

When it is determined in S4 that the first predetermined period has elapsed from start of the already charged rate timer 31 (S4: YES), the microcomputer 21 resets the already charged rate timer 31 (S5). At this time, components other than the already charged rate timer 31 and the deterioration timer 34, which have been in the sleep state, are activated.

Then, the open circuit voltage measurement unit 32 measures the open circuit voltage of the backup battery 13 (S6). The already charged rate derivation unit 33 derives the already charged rate of the backup battery 13 based on the open circuit voltage of the backup battery 13 (S7). Next, the microcomputer 21 determines whether a second predetermined period has elapsed from start of the deterioration timer 34 (S8).

When it is determined in S8 that the second predetermined period has elapsed from start of the deterioration timer 34 (S8: NO), the process of the microcomputer 21 proceeds to S1. When it is determined in S8 that the second predetermined period has elapsed from start of the deterioration timer 34 (S8: YES), the microcomputer 21 resets the deterioration timer 34 (S9). The internal resistance measurement unit 35 measures the internal resistance of the backup battery 13 (S10). The deterioration degree derivation unit 36 derives the deterioration degree of the backup battery 13 based on the internal resistance of the backup battery 13 (S11). Thereafter, the process of the microcomputer 21 proceeds to B in FIG. 4.

After the process of S11, as shown in FIG. 4, the microcomputer 21 determines whether the ignition switch 15 is on (S21). When it is determined in S21 that the ignition switch 15 is not on (S21: NO), the process proceeds to C in FIG. 3. When it is determined in S21 that the ignition switch 15 is on (S21: YES), the target charging rate derivation unit 38 calculates the target charging rate based on the deterioration degree and the temperature of the backup battery 13 (S22). Thereafter, the charging control unit 39 determines whether the already charged rate is smaller than the target charging rate (S23).

When it is determined in S23 that the already charged rate is not smaller than the target charging rate (S23: NO), the control process is ended. When it is determined in S23 that the already charged rate is smaller than the target charging rate (S23: YES), the charging control unit 39 charges the backup battery 13 until the already charged rate reaches the target charging rate (S24). Next, the microcomputer 21 resets the already charged rate timer 31 (S25). Thereafter, the microcomputer 21 determines whether electric power can be supplied from the main battery 12 to the load 11 (S26).

When it is determined in S26 that the electric power can be supplied from the main battery 12 (S26: YES), the microcomputer 21 causes the electric power to be supplied from the main battery 12 to the load 11 (S27). When it is determined in S26 that the electric power cannot be supplied from the main battery 12 to the load 11 (S26: NO), the microcomputer 21 causes the electric power to be supplied from the backup battery 13 to the load 11 (S28). Then, the load 11 such as the driver assistance device is continuously driven by the remaining capacity of the backup battery 13.

As described above in detail, the control module 16 of the present embodiment includes the open circuit voltage measurement unit 32, the already charged rate derivation unit 33, the internal resistance measurement unit 35, the deterioration degree derivation unit 36, the target charging rate derivation unit 38 that derives the target charging rate serving as the charging target based on the deterioration degree derived by the deterioration degree derivation unit 36 such that a required remaining capacity required for the load 11 is secured in the backup battery 13 when the electric power supply from the main battery 12 to the load 11 is cut off, and the charging control unit 39 that charges the backup battery 13 until the target charging rate is reached when it is determined that the already charged rate is smaller than the target charging rate based on the deterioration degree.

According to the configuration of the backup battery control module, when the ignition switch 15 is off, the already charged rate derivation unit 33 derives the already charged rate of the backup battery 13 based on the open circuit voltage measured by the open circuit voltage measurement unit 32, and the deterioration degree derivation unit 36 derives the deterioration degree of the backup battery 13 based on the internal resistance measured by the internal resistance measurement unit 35. Therefore, the problem that it is difficult to accurately measure the open circuit voltage and the internal resistance by the electric power and the like applied to the main battery 12 or the load 11, which occurs when the ignition switch 15 is on, is solved. As a result, the already charged rate and the deterioration degree of the backup battery 13 can be measured more accurately than when the ignition switch 15 is on. If the deterioration degree can be accurately measured, the target charging rate can be derived more accurately. Further, it is also more accurately determined that the already charged rate is smaller than the target charging rate. Further, it is possible to more reliably secure the required remaining capacity required to continue the driving of the load for causing the vehicle to travel. As a result, it is possible to reduce occurrence of a situation, in which the backup battery 13 does not secure the required remaining capacity required to continue driving of the load for causing the vehicle to travel when the electric power supply by the main battery 12 is cut off and the driving of the load for causing the vehicle to travel is to be continued, as compared with the related art.

Further, when the ignition switch 15 is on, the target charging rate derivation unit 38 acquires the target charging rate, and the charging control unit 39 charges the backup battery 13 based on the target charging rate derived by the target charging rate derivation unit 38. According to such a configuration, when the ignition switch 15 is off, a decrease in the capacity of the main battery 12 is prevented as compared with the case where the same operation is performed.

Further, the control module 16 further includes the temperature information acquisition unit 37. The target charging rate derivation unit 38 acquires the target charging rate serving as the charging target based on the temperature information acquired by the temperature information acquisition unit 37 in addition to the deterioration degree derived by the deterioration degree derivation unit 36. According to such a configuration, it is possible to acquire a more suitable value as the target charging rate by taking into account the temperature information.

Further, the microcomputer 21 is provided separately from the vehicle-side control unit 41 that controls the driving of the vehicle. According to such a configuration, if the vehicle-side control unit 41 performs charging control, it is necessary to construct a system for each vehicle type, whereas the microcomputer 21 performs the charging control separately from the vehicle-side control unit 41, and thus it is not necessary to construct a system for each vehicle type. Further, it is possible to avoid an increase in a load on the vehicle-side control unit 41 for charging the backup battery 13.

The present disclosure has been described based on the embodiments, but the present disclosure is not limited to the embodiment described above and may be appropriately modified without departing from the spirit of the present disclosure, and other techniques may be appropriately combined within a possible range.

[First Modification]

In the embodiment described above, the table of FIG. 2E is used as a target charging rate, but the present disclosure is not limited to the embodiment described above. For example, the following correction formula (1) may be created, and the target charging rate may be set based on the correction formula (1). When the target charging rate at a deterioration degree of 0% and a temperature of 25° C. is used as a reference, the target charging rate at a deterioration degree of P % and a temperature of T° C. can be derived as follows:

$$\text{the target charging rate}(P \% \text{ and } T° \text{C.}) = \text{target charging rate}(0\% \text{ and } 25° \text{C.}) \times \text{temperature coefficient} \times (\text{current battery temperature } T[° \text{C.}] - 25[° \text{C.}]) \times \text{deterioration coefficient} \times (1 - \text{deterioration degree } P[\%]/100[\%]) \ldots \quad (1)$$

[Second Modification]

In the embodiment described above, the control process of the microcomputer 21 is ended in S28 of FIG. 4, but the present disclosure is not limited to the above embodiment, and the microcomputer 21 may perform control as follows. For example, after the process of S28, the microcomputer 21 determines whether electric power can be supplied from the backup battery 13 to the load 11. Then, when it is determined that the electric power cannot be supplied from the backup battery 13 to the load 11, the microcomputer 21 stops the function of the backup battery 13 to protect the backup battery 13. Alternatively, when it is determined that the electric power can be supplied from the backup battery 13 to the load 11 (for example, when a threshold value of over-discharge or over-heating is reached), the microcomputer 21 supplies the electric power from the backup battery 13 to the load 11. The configuration may be as described above.

[Third Modification]

In the embodiment described above, the deterioration degree is derived by comparing the internal resistances, of the new battery and the current battery, based on the voltage drop amount and the discharge current due to the discharge of the backup battery 13, but the present disclosure is not limited to the embodiment described above, and the microcomputer 21 may control the internal resistance as follows. Hereinafter, the above will be described with reference to FIG. 2D.

FIG. 2D is a graph showing a relationship between the battery voltage and the discharging time of the backup battery when the discharging time is long. The vertical axis represents the battery voltage of the backup battery 13, and the horizontal axis represents the discharging time of the backup battery 13. The graph J1 is a graph (0% deterioration) of a new backup battery 13, and the graph J2 is a graph (for example, 20% deterioration) of a used (current) backup battery 13 after a predetermined period has elapsed from the start of use.

The internal resistance measurement unit 35 measures a discharging time from a state in which the backup battery 13 is charged to a state in which the backup battery 13 is discharged at 80 A and reaches 10.5 V, which is a minimum drive voltage of the load 11. The longer the discharging time is, substantially the smaller the internal resistance is and the smaller the deterioration degree is, and the shorter the discharging time is, substantially the larger the internal resistance is and the larger the deterioration degree is. For example, in a case of the new backup battery 13, as indicated by J1 in FIG. 2D, the internal resistance measuring unit 35 measures that the time has three minutes to discharge from the battery voltage Y1 V and reach a voltage Y0(=10.5) V. Further, in a case of the backup battery 13 for which a predetermined period has elapsed from the start of use, as indicated by J2 in FIG. 2D, the internal resistance measuring unit 35 measures that the time has 2 minutes and 40 seconds to discharge from the battery voltage Y2 V and reach a voltage Y0(=10.5) V.

The deterioration degree derivation unit 36 derives the deterioration degree of the backup battery 13 based on the measurement result of the internal resistance measurement unit 35. For example, when the discharging time of the backup battery 13 measured by the internal resistance measurement unit 35 is 3 minutes, the deterioration degree derivation unit 36 derives (evaluates) that the deterioration degree of the backup battery 13 is 0% deterioration because the discharging time corresponds to the graph J1 of FIG. 2D. Further, when the discharging time of the backup battery 13 measured by the internal resistance measurement unit 35 is 2 minutes and 40 seconds, the deterioration degree derivation unit 36 derives (evaluates) that the deterioration degree of the backup battery 13 is 20% deterioration because the discharging time corresponds to the graph J2 of FIG. 2D.

[Fourth Modification]

In the embodiment described above, the target charging rate derivation unit 38 is configured to acquire the target charging rate serving as the charging target based on the deterioration degree derived by the deterioration degree derivation unit 36 and the temperature information acquired by the temperature information acquisition unit 37, but the present disclosure is not limited to the embodiment described above. For example, the target charging rate derivation unit 38 may be configured to acquire the target charging rate serving as the charging target based on the deterioration degree derived by the deterioration degree derivation unit 36.

As described above, a backup battery control module 16 configured to supply electric power from a main battery 12 to a load 11 required for causing a vehicle to travel and supply electric power from a backup battery 13 to the load 11 when electric power supply from the main battery 12 to the load 11 is cut off. The backup battery control module 16 includes: an open circuit voltage measurement unit 32 configured to measure an open circuit voltage of the backup battery 13 every first predetermined time in a state in which an ignition switch 15 is off, to obtain a measured open circuit voltage; an already charged rate derivation unit 33 configured to derive, based on the measured open circuit voltage, an already charged rate of the backup battery 13 that has already been charged; an internal resistance measurement unit 35 configured to measure an internal resistance of the backup battery 13 at every second predetermined time in a state in which the ignition switch 15 is off, to obtain a measured internal resistance; a deterioration degree derivation unit 36 configured to derive a deterioration degree of the backup battery 13 based on the measured internal resistance;

a target charging rate derivation unit 38 configured to derive a target charging rate serving as a charging target based on the deterioration degree such that a required remaining capacity required for the load 11 is secured in the backup battery 13 even when the electric power supply from the main battery 12 to the load 11 is cut off; and a charging control unit 39 configured to charge the backup battery 13 until the target charging rate is reached in a case in which it is determined that the already charged rate is smaller than the target charging rate.

According to the backup battery control module 16, in a state in which the ignition switch 15 is off, the already charged rate derivation unit 33 derives the already charged rate of the backup battery 13 based on the open circuit voltage measured by the open circuit voltage measurement unit 32, and the deterioration degree derivation unit 36 derives the deterioration degree of the backup battery 13 based on the internal resistance measured by the internal resistance measurement unit 35. Therefore, it is possible to solve the technical problem in which it is difficult to accurately measure the open circuit voltage and the internal resistance by the electric power and the like applied to the main battery 12 or the load 11, which occurs in a state in which the ignition switch 15 is on. As a result, the already charged rate and the deterioration degree of the backup battery 13 can be measured more accurately than in a state in which the ignition switch 15 is on. As the deterioration degree can be measured more accurately, the target charging rate can be derived more accurately. Further, it is also more accurately determined whether the already charged rate is smaller than the target charging rate. Further, it is possible to more reliably secure the required remaining capacity required to continue the driving of the load for causing the vehicle to travel. As a result, as compared with the related art, it is possible to reduce occurrence of a situation in which a backup battery does not secure a required remaining capacity required to continue driving of a load for causing a vehicle to travel when electric power supply by a main battery is cut off and the driving of the load for causing the vehicle to travel is to be continued.

In the backup battery control module 16, in a state in which the ignition switch 15 is on, the target charging rate derivation unit 38 is configured to derive the target charging rate based on the deterioration degree, and the charging control unit 39 is configured to charge the backup battery 13 until the target charging rate is reached in a case in which it is determined that the already charged rate is smaller than the target charging rate.

The backup battery control module 16 includes a temperature information acquisition unit 37 configured to acquire temperature information of the backup battery 13. The target charging rate derivation unit 38 is configured to acquire the target charging rate based on the temperature information in addition to the deterioration degree.

In the backup battery control module 16, the open circuit voltage measurement unit 32, the already charged rate derivation unit 33, the internal resistance measurement unit 35, the deterioration degree derivation unit 36, the target charging rate derivation unit 38, and the charging control unit 39 are provided separately from a vehicle-side control unit 41 configured to control driving of the vehicle.

A backup battery control system 10 includes: the backup battery control module 16; the load 11; the main battery 12; and the backup battery 13.

The invention claimed is:

1. A backup battery control module configured to supply electric power from a main battery to a load required for causing a vehicle to travel and supply electric power from a backup battery to the load when electric power supplied from the main battery to the load is cut off, the backup battery control module comprising:
an open circuit voltage measurement unit configured to measure an open circuit voltage of the backup battery periodically, at a first predetermined time interval while in a state in which an ignition switch is off, to obtain a measured open circuit voltage;
an already charged rate derivation unit configured to derive, based on the measured open circuit voltage, an already charged rate of the backup battery that has already been charged;
an internal resistance measurement unit configured to measure an internal resistance of the backup battery periodically, at a second predetermined time interval while in a state in which the ignition switch is off, to obtain a measured internal resistance;
a deterioration degree derivation unit configured to derive a deterioration degree of the backup battery based on the measured internal resistance;
a target charging rate derivation unit configured to derive a target charging rate serving as a charging target based on the deterioration degree such that a required remaining capacity required for the load is secured in the backup battery even when the electric power supply from the main battery to the load is cut off; and
a charging control unit configured to charge the backup battery until the target charging rate is reached in a case in which it is determined that the already charged rate is smaller than the target charging rate.

2. The backup battery control module according to claim 1,
wherein in a state in which the ignition switch is on,
the target charging rate derivation unit is configured to derive the target charging rate based on the deterioration degree, and
the charging control unit is configured to charge the backup battery until the target charging rate is reached in a case in which it is determined that the already charged rate is smaller than the target charging rate.

3. The backup battery control module according to claim 2, further comprising:
a temperature information acquisition unit configured to acquire temperature information of the backup battery,
wherein the target charging rate derivation unit is configured to acquire the target charging rate based on the temperature information in addition to the deterioration degree.

4. The backup battery control module according to claim 1,
wherein the open circuit voltage measurement unit, the already charged rate derivation unit, the internal resistance measurement unit, the deterioration degree derivation unit, the target charging rate derivation unit, and the charging control unit are provided separately from a vehicle-side control unit configured to control driving of the vehicle.

5. A backup battery control system comprising:
the backup battery control module according to claim 1;
the load;
the main battery; and
the backup battery.

6. The backup battery control module according to claim 1, wherein the internal resistance measurement unit is configured to measure a voltage drop amount when the backup battery is discharged at a specified current and measure the internal resistance based on the voltage drop amount and the discharge current.

7. A backup battery control module configured to supply electric power from a main battery to a load required for causing a vehicle to travel and supply electric power from a backup battery to the load when electric power supplied from the main battery to the load is cut off, the backup battery control module comprising:
   a processor; and
   a memory storing instructions that, when executed by the processor, cause the backup battery control module to perform operations comprising:
      measuring an open circuit voltage of the backup battery periodically, at a first predetermined time interval while in a state in which an ignition switch is off, to obtain a measured open circuit voltage;
      determining, based on the measured open circuit voltage, an already charged rate of the backup battery that has already been charged;
      measuring an internal resistance of the backup battery periodically, at a second predetermined time interval while in a state in which the ignition switch is off, to obtain a measured internal resistance;
      determining a deterioration degree of the backup battery based on the measured internal resistance;
      determining a target charging rate serving as a charging target based on the deterioration degree such that a required remaining capacity required for the load is secured in the backup battery even when the electric power supply from the main battery to the load is cut off; and
      charging the backup battery until the target charging rate is reached in a case in which it is determined that the already charged rate is smaller than the target charging rate.

8. A backup battery control system comprising:
   the backup battery control module according to claim 7;
   the load;
   the main battery; and
   the backup battery.

9. The backup battery control module according to claim 8,
   wherein in a state in which the ignition switch is on,
      the determining the target charging rate comprises determining the target charging rate based on the deterioration degree, and
      the charging the backup battery comprises charging the backup battery until the target charging rate is reached in a case in which it is determined that the already charged rate is smaller than the target charging rate.

10. The backup battery control module according to claim 9, wherein the instructions, when executed by the processor, cause the backup battery control module to perform operations further comprising:
   acquiring temperature information of the backup battery,
   wherein the determining the target charging rate comprises acquiring the target charging rate based on the temperature information in addition to the deterioration degree.

11. The backup battery control module according to claim 8,
   wherein the processor and memory are provided separately from a vehicle-side control unit configured to control driving of the vehicle.

12. The backup battery control module according to claim 8, wherein the measuring the internal resistance comprises measuring a voltage drop amount when the backup battery is discharged at a specified current and measuring the internal resistance based on the voltage drop amount and the discharge current.

* * * * *